(12) United States Patent
Bergogne

(10) Patent No.: US 10,116,304 B2
(45) Date of Patent: Oct. 30, 2018

(54) GATE TRANSISTOR CONTROL CIRCUIT

(71) Applicant: Commissariat à l'Energie Atomique et aux Energies Alternatives, Paris (FR)

(72) Inventor: Dominique Bergogne, Sant Didier en Velay (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 15/382,650

(22) Filed: Dec. 17, 2016

(65) Prior Publication Data
US 2017/0187373 A1    Jun. 29, 2017

(30) Foreign Application Priority Data

Dec. 24, 2015   (FR) ...................... 15 63354

(51) Int. Cl.
*H03K 3/00*       (2006.01)
*H03K 17/687*     (2006.01)
*H03K 19/0175*    (2006.01)
*H02M 1/08*       (2006.01)
*H03K 17/14*      (2006.01)

(52) U.S. Cl.
CPC .......... *H03K 17/6871* (2013.01); *H02M 1/08* (2013.01); *H03K 17/145* (2013.01); *H03K 19/017509* (2013.01); *H03K 2217/0081* (2013.01)

(58) Field of Classification Search
CPC ................................. H03K 17/6871
See application file for complete search history.

(56) References Cited

U.S. PATENT DOCUMENTS

| | | | |
|---|---|---|---|
| 5,216,294 A | 6/1993 | Ryu | |
| 2008/0290911 A1* | 11/2008 | Williams | ............... H03K 17/18 327/109 |
| 2011/0012542 A1 | 1/2011 | Inamura et al. | |

FOREIGN PATENT DOCUMENTS

EP      2824835 A1    1/2015

OTHER PUBLICATIONS

Preliminary Search Report in French Patent Application No. 1563354; dated Aug. 29, 2016, 2 pages.
Perrin, Remi et al.; GaN Power Module with High Temperature Gate Driver and Insulated Power Supply; IMAPS International Conference and Exhibition on High Temperature Electronics (HITEC), Jan. 2014.

\* cited by examiner

*Primary Examiner* — Daniel Puentes
(74) *Attorney, Agent, or Firm* — Moreno IP Law LLC

(57) ABSTRACT

A device for controlling a first control gate transistor, including: a second transistor and a third transistor series-connected between a first and a second terminals of application of a power supply voltage, the junction point of these transistors being connected to the gate of the first transistor; a terminal of application of a digital control signal; a circuit for generating an analog signal according to variations of the power supply voltage; and for each of the second and third transistors, a circuit of selection of a control signal of the first transistor representative of said digital signal or of said analog signal.

10 Claims, 4 Drawing Sheets

GATE TRANSISTOR CONTROL CIRCUIT

CROSS-REFERENCE TO RELATED APPLICATION

This application claims the priority benefit of French patent application number 15/63354, the content of which is hereby incorporated by reference in its entirety to the maximum extent allowable by law.

BACKGROUND

The present disclosure generally relates to electronic systems and, more particularly, to a voltage regulator intended to equip such systems. The present disclosure more specifically relates to a gate power transistor control circuit.

DISCUSSION OF THE RELATED ART

In almost all electronic systems, circuits regulating a voltage of power supply of various components and circuits of the system are used.

So-called "shunt" regulators which use a power component, generally a MOS transistor connected to the load to be supplied with a regulated voltage, are in particular known. Such regulators are for example used to regulate the charge voltage of a battery, for example, a vehicle battery or batteries used in photovoltaic plants.

Further, the control of power transistors uses a control or driver circuit applying a control signal to its gate. Now, such a control circuit requires a regulated power supply voltage, which requires an additional regulation circuit.

More generally, when a power transistor is used in an electronic system, the control of this transistor generally requires a regulated voltage for reasons of accuracy of the signal applied to its gate.

There is a need to improve drivers for gate power transistors.

SUMMARY

An embodiment overcomes all or part of the disadvantages of usual power transistor control circuits.

An embodiment provides a less bulky solution.

An embodiment provides a solution particularly adapted to a pulse-width modulation control of an output stage of the control circuit.

Thus, an embodiment provides a device for controlling a first control gate transistor, comprising:

a second transistor and a third transistor series-connected between a first and a second terminals of application of a power supply voltage, the junction point of these transistors being connected to the gate of the first transistor;

a terminal of application of a digital control signal;

a circuit for generating an analog signal according to variations of the power supply voltage; and for each of the second and third transistors, a circuit of selection of a control signal of the first transistor representative of said digital signal or of said analog signal.

According to an embodiment, the selection between the digital signal and the analog signal is performed based on a signal representative of said digital signal.

According to an embodiment, that of the second and third transistors which is controlled according to the digital signal operates in linear state, while the other one, controlled according to the analog signal, operates in saturated state.

According to an embodiment, each selection circuit comprises an analog switch having an input receiving the analog signal and a digital inverter having an input receiving the digital signal, the outputs of the switch and of the inverter being connected to the gate of the concerned transistor.

According to an embodiment, the switch and the inverter have a high-impedance output state.

According to an embodiment, the device further comprises level-shifting circuits between the digital and analog signal generation circuits and the selection circuit assigned to one of the second and third transistors.

According to an embodiment, the analog signal generation circuit is a PID regulator.

According to an embodiment, the digital signal generation circuit supplies a pulse train of variable length.

According to an embodiment, the transistors are MOS transistors.

An embodiment provides a method of controlling a first control gate transistor, from a second transistor and a third transistor in series having their junction point connected to the gate of the first transistor, wherein one of the second and third transistors is controlled in linear state while the other one is controlled in saturated state.

The foregoing and other features and advantages will be discussed in detail in the following non-limiting description of specific embodiments in connection with the accompanying drawings.

DETAILED DESCRIPTION OF THE PRESENT EMBODIMENTS

Figure 1:
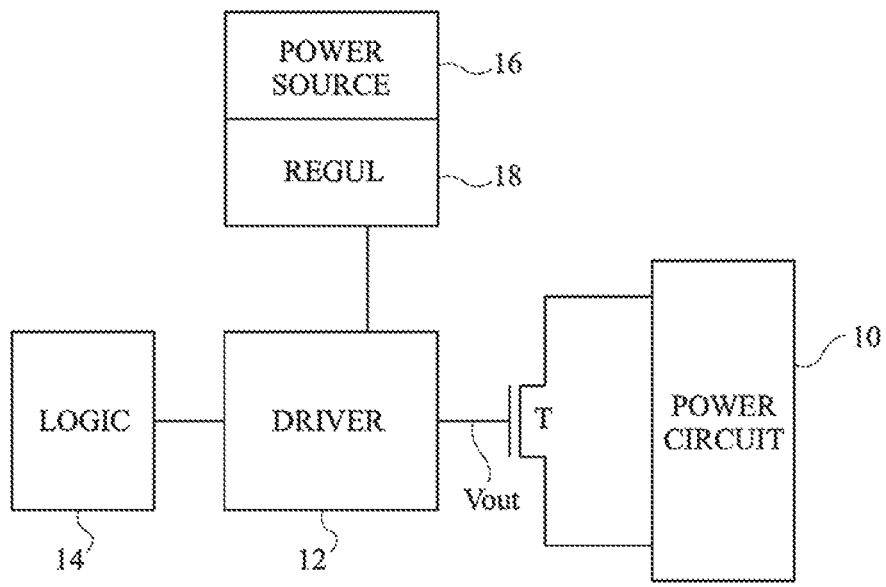
FIG. 1 is a partial simplified block diagram of a usual example of a gate power transistor supply and control device.

For clarity, only those elements which are useful to the understanding of the described embodiments have been shown and will be detailed. In particular, the forming of the actual power transistor, controlled by the described circuit, has not been detailed, the described embodiments being compatible with usual power transistor technologies. Further, the applications of the shunt regulator comprising the described control circuit have not been detailed, the described embodiments being, here again, compatible with usual applications of such control circuits.

It should be noted that, in the drawings, the structural and/or functional elements common to the different embodiments may be designated with the same reference numerals and may have identical structural, dimensional, and material properties.

Unless otherwise specified, expressions "approximately", "substantially", and "in the order of" mean to within 10%, preferably to within 5%.

FIG. 1 is a partial simplified block diagram of a usual example of a device for powering and controlling a gate power transistor T, integrating a voltage regulation function.

Transistor T is connected to a power circuit 10 (POWER CIRCUIT).

The gate of transistor T receives a voltage Vout for controlling a control circuit 12 (DRIVER). In the targeted applications, control circuit 12 receives an order from a logic circuit 14 (LOGIC), typically a circuit generating pulse-width modulated signals according to the needs of the power circuit. Circuit 12 is powered from a power source 16 (POWER SOURCE). In the example of FIG. 1, the power (voltage or current) supplied by source 16 should be regulated (regulator 18—REGUL) before being supplied to the control circuit.

The need to use different circuits generates many disadvantages, among which an increased number of components implying an increased risk of reliability problems, a greater bulk, an additional influence of manufacturing tolerances, the need to intervene on the power source for the regulation thereof, etc.

The inventors provide taking advantage of the internal structure of the control circuit and more particularly of its output stage to include a regulation function in the actual control circuit.

Figure 2:
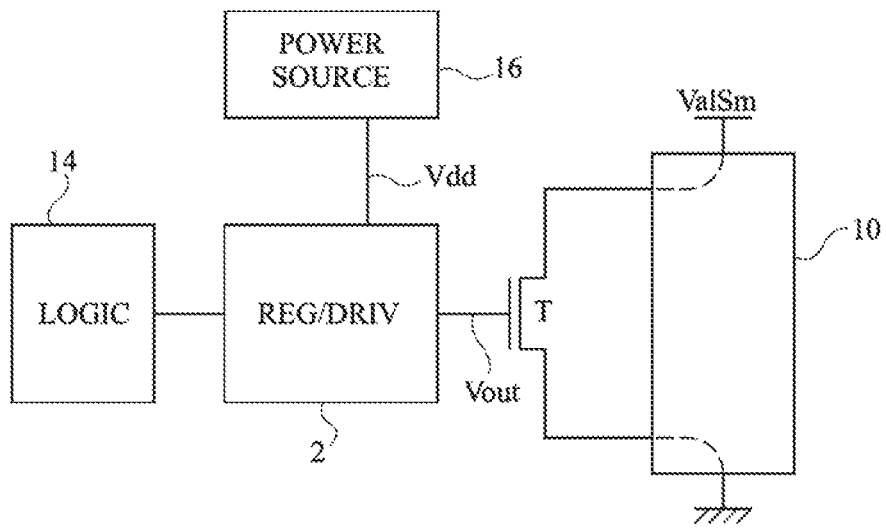
FIG. 2 is a partial simplified block diagram of an embodiment of a gate power transistor supply and control device.

FIG. 2 is a partial simplified block diagram of an embodiment of a gate power transistor supply and control device.

This device controls a power transistor T connected to a power circuit.

According to the embodiment of FIG. 2, a control circuit or driver 2 (REGDRIV) advantageously integrates a function of regulation of a voltage or of a current received from a power source 16. Power source 16 here needs not be associated with a regulator upstream of circuit 2. Circuit 2 also receives one or a plurality of orders from a logic circuit 14 (LOGIC), typically a circuit generating pulse-width modulated signals according to the needs of power circuit 10. In practice, circuit 14 obtains this information by measurements (not shown) of information at the level of the power circuit. Circuit 2 supplies a gate voltage Vout to transistor T.

Among the constraints which have appeared to the inventors for the forming of control circuit 2, the following should be noted:
the need for an accurate control of the gate of transistor T which conditions the operation of the power circuit;
the need to remain compatible with a control by pulse-width modulation.

Figure 3:
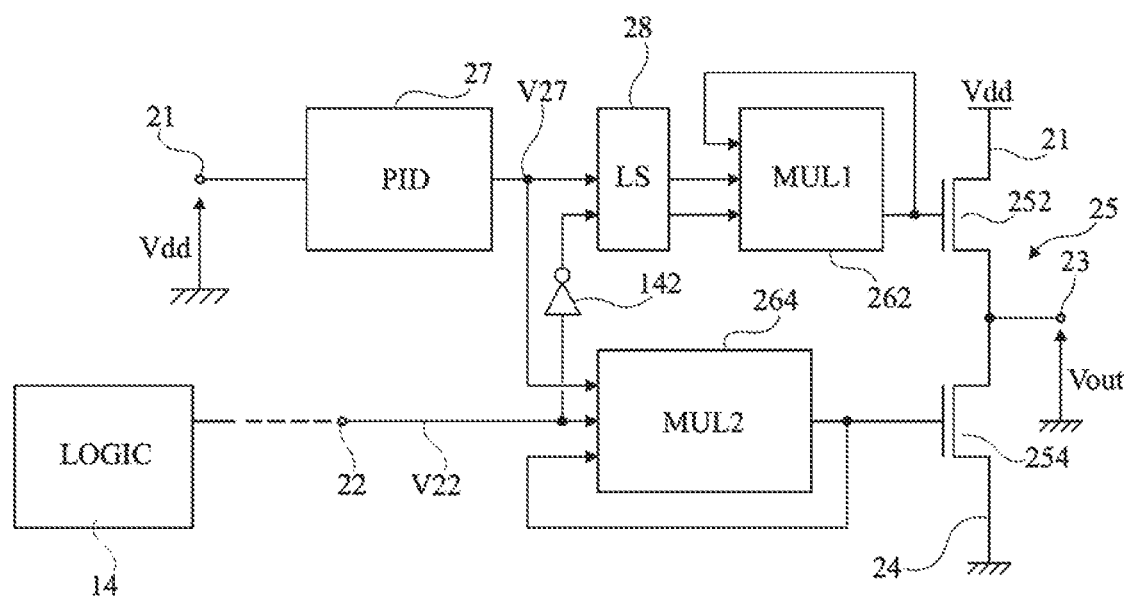
FIG. 3 is a block diagram of an embodiment of a circuit for controlling the device of FIG. 2.

FIG. 3 shows, in the form of blocks, an embodiment of control circuit 2 of the device of FIG. 2.

Circuit 2 comprises a terminal 21 of application of a voltage Vdd to be regulated. Voltage Vdd originates, for example, from power source 16 of FIG. 2. Circuit 2 also comprises an input terminal 22 intended to receive a logic signal for controlling circuit 14, an output terminal 23 supplying voltage Vout, and a terminal 24 of connection to a reference potential, for example, the ground.

An output stage 25 of circuit 2 comprises two MOS transistors 252 and 254 series-connected between terminals 21 and 24, the junction point thereof defining terminal 23.

Transistors 252 and 254 are controlled according to order signal V22, comprising a pulse train, supplied by logic block 14. They are controlled to avoid simultaneously conducting and their respective conduction periods enable to control voltage Vout applied to the gate of transistor T.

According to the described embodiments, one of the transistors is controlled in all or nothing (linear state in the ohmic area at a low drain-source voltage Vds) while the other is used as a controllable current source (saturated state in an area having a high drain-source voltage Vds, close to voltage Vdd). For simplification, the transistor will be called conductive hereafter when it operates in linear state (switch), knowing that it is actually also conductive (by a lesser extent) when it is in saturated mode.

When transistor 252 is conductive, transistor 254 is controlled according to an error voltage V27 representative of the variation of voltage Vdd with respect to a nominal value. When transistor 254 is conductive, transistor 252 is controlled in turn according to error voltage V27 representative of the variation of voltage Vdd with respect to its nominal value. Thus, on the one hand, the pulse width, which is a function of the order supplied by block 14, provides the usual control signal but, further, the current variation in each of the transistors while the other one is conductive regulates the amplitude of the pulses according to possible variations of voltage Vdd. This indirectly amounts to regulating power supply voltage Vdd. The transistor 252 or 254 which operates as a current source plays, in a way, the role of a shunt regulator in control circuit 2.

The control of each transistor 252, 254 originates from a circuit or multiplexer 262 (MUL1), respectively 264 (MUL2), carrying out a function of selection between two signals from among a digital signal V22, or its inverse (inverter 142) for transistor 252, supplied by logic circuit 14, and an analog signal V27 representative of the DC power supply voltage Vdd applied across the series association of transistors 252 and 254. Preferably, but optionally, signal V27 is supplied by a PID (Proportional-Integral-Differential) regulator 27. Each circuit 262, 264 is controlled by a digital signal representative of the state (off or on) of the concerned transistor 252 or 254 detecting its conduction periods from its gate. For the upper half-stage (transistor 252), voltage V27 and the inverse of voltage V22 are supplied by a level-shifting circuit 28 (LS).

Figure 4:
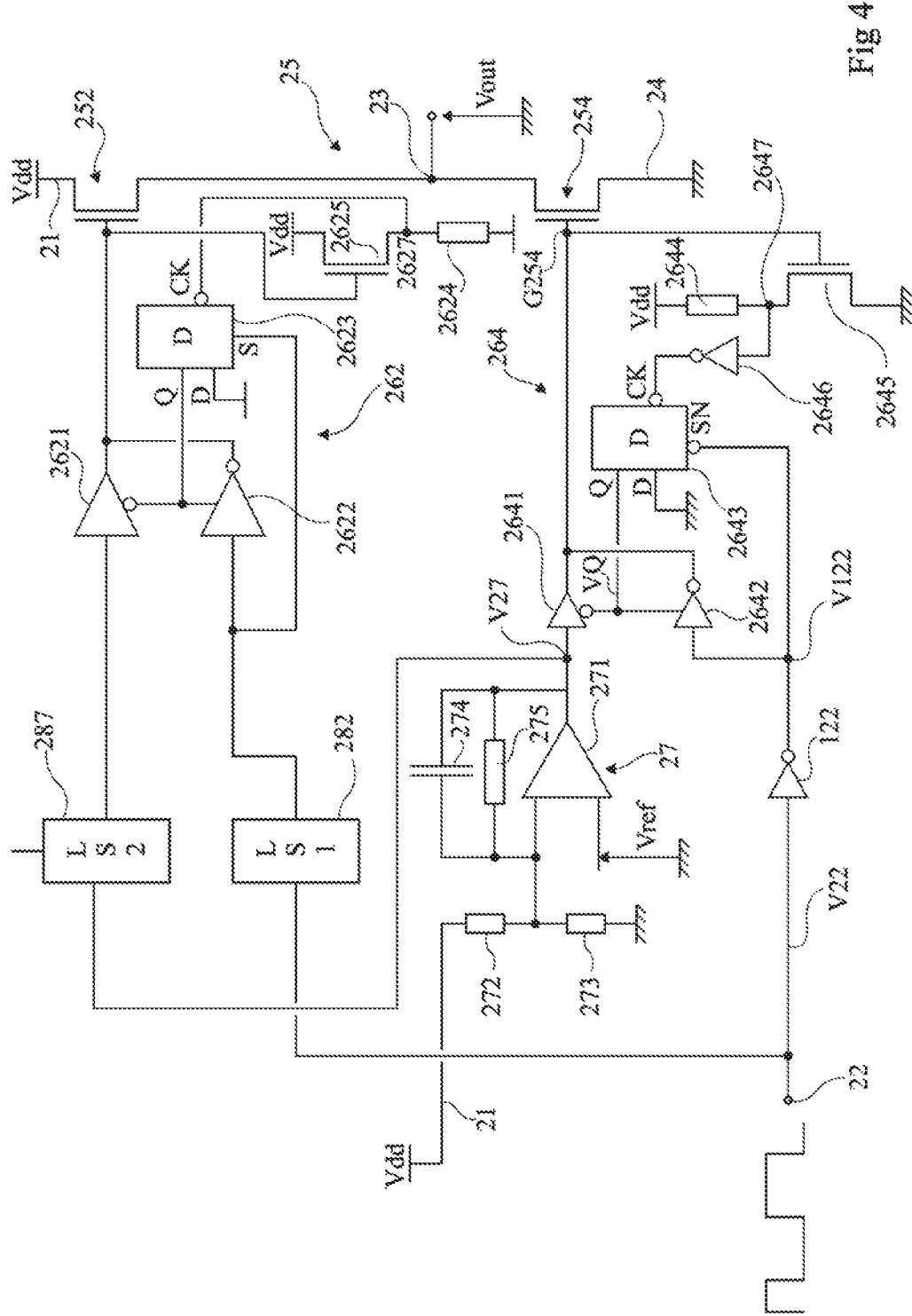
FIG. 4 is a more detailed electric diagram of an embodiment of the control circuit of FIG. 3.

FIG. 4 is a more detailed electric diagram of the circuit of FIG. 2 illustrating an embodiment.

PID regulator 27 comprises an operational amplifier 271 having a first input receiving a reference voltage Vref and having a second input receiving, via a resistive voltage-dividing bridge (series-connected resistors R272 and R273 between terminal 21 and the ground), information proportional to voltage Vdd. The output of amplifier 271 is connected to its input (junction point of resistors 272 and 273) by an RC cell formed of a capacitor 274 and of a resistor 275, integrating the voltage difference between the amplifier inputs. The values of voltage Vref and of resistors R271 and R272 are selected according to the nominal value of voltage Vdd.

On the lower half-stage side, multiplexer 264 comprises an analog switch 2641 between the output of amplifier 271 and the gate of transistor 254 and a three-state logic inverter 2642 between terminal 22 and the gate of transistor 254. In the example of FIG. 4, an inverter 122 is actually interposed between terminal 22 and the input of inverter 2642. Switch 2641 and inverter 2642 have a high-impedance output when they are deactivated. Switch 2642 and inverter 2641 are activated, respectively by a signal sampled from the direct output (Q) of a D-type flip-flop 2643, and by the inverse of this signal. The D input of flip-flop 2643 is grounded. The inverted set input SN of flip-flop 2643 is connected to the output of inverter 122. The clock input CK of flip-flop 2643 receives a logic indication of the state of transistor 254. For example, inverted clock input CK (active on a falling edge) is connected, via an inverter 2646, to the junction point 2647 of a resistor 2644 and of a transistor 2645 having voltage Vdd applied thereto. The gate of transistor 2645 is connected to the gate of transistor 254. This assembly forms a detector of a state change of transistor 254 from the linear state (gate voltage much greater than threshold voltage Vth of the transistor—conductive operation) to the saturated mode (gate voltage close to threshold voltage Vth of the transistor—operation as a current source).

A similar structure is present on the upper half-stage side, to within the difference that signals V22 and V27 are respectively applied via level-shifting circuits 282 (LS1) and 287 (LS2) and that the logic indication of the transistor state is provided by a slightly different circuit. Thus, multiplexer 262 comprises an analog switch 2621 between the output of level-shifting circuit 287 (having its input connected to the output of amplifier 271) and the gate of transistor 252 and a three-state logic inverter 2622 between the output of level-shifting circuit 282 and the gate of transistor 252. As compared with the lower half-stage, signal V22 is here not inverted. Switch 2621 and inverter 2622 have a high-impedance output when they are deactivated. Switch 2622 and inverter 2621 are activated, respectively by a signal sampled from the direct output (Q) of a D-type flip-flop 2623 and by the inverse of this signal. The D input of flip-flop 2623 is connected to the low logic level (0). Set input S of flip-flop 2623 is connected to the output of level shifter 282. Clock input CK of flip-flop 2623 receives a logic indication of the state of transistor 252. For example, inverted clock input CK (active on a falling edge) is connected to the junction point 2627 of a resistor 2624 and of a transistor 2625 having voltage Vdd applied thereto. The gate of transistor 2624 is connected to the gate of transistor 252. This assembly forms a detector of a state change of transistor 252 from the linear state (gate voltage much greater than threshold voltage Vth of the transistor—conductive operation) to the saturated mode (gate voltage close to threshold voltage Vth of the transistor—operation as a current source). On the upper half-stage side, the reference potential (low level) of circuits 2621, 2622, 2623 and applied to resistor 2624 is a local ground, shifted by the level-shifting circuits with respect to the ground of the lower half-stage.

The operation of circuit 2 and, more particularly, of multiplexers 262 and 264, is the following. For simplification, the voltage drops in the output transistors of circuits 2641 and 2642 as well as the voltage drops in the output stages of the logic gates and inverters are neglected.

Figure 5:
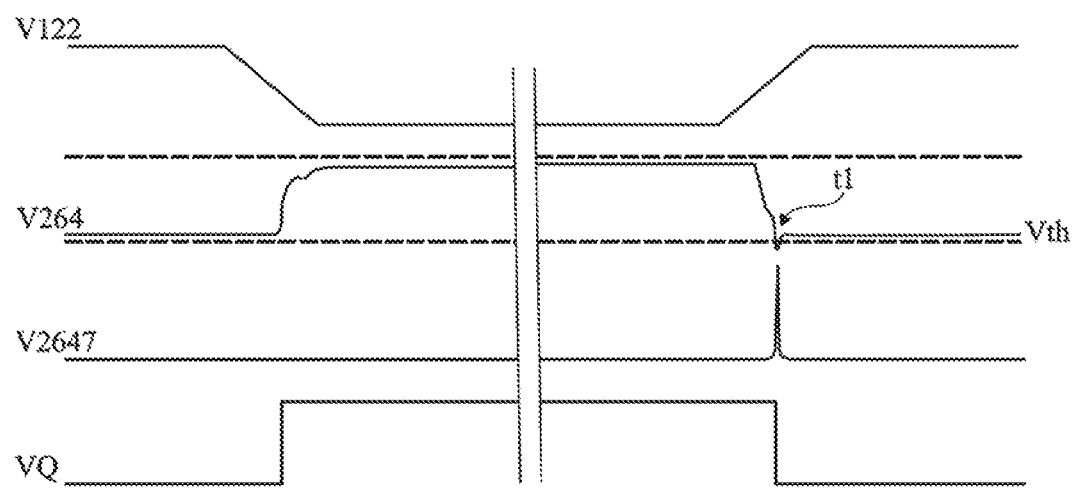
FIG. 5 illustrates, in the form of timing diagrams, the operation of the circuit of FIG. 4.

FIG. 5 illustrates the operation of circuit 262, in the form of timing diagrams showing examples of shapes of control signal V122, of signal V264 applied to the gate of transistor 254, of output voltage V2647 of the comparator (resistor 2644—transistor 2645) of the gate voltage of transistor 254 with respect to its threshold Vth, and of signal VQ of the Q output of flip-flop 2643.

An initial state where signal V122 is in the high state (control signal V22 in the low state) and the Q output of flip-flop 2643 is in the low state is assumed. Analog amplifier 2641 is then active. Transistor 254 then saturates and its drain-source resistance is a function of error voltage V27 transferred by analog amplifier 2641. Voltage V254 is then close to threshold voltage Vth (not shown). The output of circuit 2642 is in high impedance to avoid disturbing the correction. Signal V2647 is in the low state.

When signal V122 switches to the low state (signal V22 switches to the high state), inverted set input SN of flip-flop 2643 receives a falling edge, which causes the setting to one of the Q output. This inverts the activation of amplifiers 2641 and inverter 2642. Thus, gate G254 of transistor 254 receives the output state of inverter 2642 which is in the high state (double inversion of the state of signal V22). Transistor 254 then switches to the linear state (strongly conductive). Amplifier 2641 is deactivated (high-impedance output). The state of signal V2647 is not modified.

When signal V22 switches back to the high state, signal V264 decreases to a low level under the effect of the switching of the output of inverter 2642. When the discharge of gate G254 is such that it decreases below threshold Vth (time t1) and transistor 254 blocks, this is detected by transistor 2645, which blocks. Signal V2647 then switches to a high level (close to voltage Vdd). This causes a falling edge (inversion by inverter 2646 on the inverted clock input of flip-flop 2643) and, accordingly, the taking into account on the Q output of the state present on the D input (the logic 0). Signal VQ thus switches to the low state. This causes the activation inversion between amplifier 2641 and inverter 2642. The activation of amplifier 2641 immediately makes transistor 254 conductive again in saturated state. This results in a switching of transistor 2645 and signal V2647 returns to the low state. Transistor 254 is operating, until the next switching.

The circuit then is in current source mode and regulates the level of voltage Vout according to possible variations of voltage Vdd. This state is maintained until the next switching of signal V22.

A similar operation occurs on the side of multiplexer 262 and can be deduced from the above-described operation, with the difference that due to the inversion of the control signals with respect to multiplexer 264, the periods during which transistors 252 is conductive are inverted with respect to those of transistor 254.

Thus, when transistor 252 is conductive, the level of voltage Vout is adjusted by transistor 254 according to possible variations of voltage Vdd and, when transistor 254 is conductive, the level of voltage Vdd is adjusted, by transistor 252, according to possible variations of voltage Vdd.

An advantage of the described embodiments is that the regulation of the voltage of the control circuit is performed by the actual circuit. The use of transistors dedicated to the regulation is thus spared, unlike the usual case of FIG. 1.

Another advantage is that the circuit requires no modification of the control signals supplied by circuit 14.

Various embodiments have been described. Various alterations, modifications, and improvements will occur to those skilled in the art. In particular, although the embodiments have been described in relation with the control of a MOS power transistor, they more generally apply to the control of any control gate transistor, for example, a HEMT transistor, a MOSFET transistor, an IGBT transistor, etc. Further, the practical implementation of the embodiments which have been described is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device for controlling a first control gate transistor, comprising:
   a second transistor and a third transistor series-connected between first and second terminals of application of a power supply voltage, the junction point of these transistors being connected to the gate of the first transistor,
   a terminal of application of a digital control signal;

a circuit for generating an analog signal according to variations of the power supply voltage; and for each of the second and third transistors, a circuit of selection of a control signal of the first transistor representative of said digital signal or of said analog signal, wherein the selection circuit selects a signal among said digital control signal and said analog signal such that one of the second and third transistors is controlled in a linear state while the other one of the second and third transistors is controlled in a saturated state.

2. The device of claim 1, wherein the selection between the digital signal and the analog signal is performed based on a signal representative of said digital signal.

3. The device of claim 1, wherein that of the second and third transistors which is controlled according to the digital signal operates in linear state, while the other one, controlled according to the analog signal, operates in saturated state.

4. The device of claim 1, wherein each selection circuit comprises an analog switch having an input receiving the analog signal and a digital inverter having an input receiving the digital signal, the outputs of the switch and of the inverter being connected to the gate of the concerned transistor.

5. The device of claim 4, wherein the switch and the inverter have a high-impedance output state.

6. The device of claim 1, further comprising level-shifting circuits between the digital and analog signal generation circuits and the selection circuit assigned to one of the second and third transistors.

7. The device of claim 1, wherein the analog signal generation circuit is a PID regulator.

8. The device of claim 1, wherein the circuit for generating the digital signal supplies a pulse train of variable length.

9. The device of claim 1, wherein the transistors are MOS transistors.

10. A method of controlling a first control gate transistor, from a second transistor and a third transistor in series having their junction point connected to the gate of the first transistor, wherein one of the second and third transistors is controlled in linear state while the other one is controlled in saturated state.

* * * * *